(12) United States Patent
Sugihara et al.

(10) Patent No.: US 7,359,546 B2
(45) Date of Patent: Apr. 15, 2008

(54) DEFECT INSPECTION APPARATUS AND DEFECT INSPECTION METHOD

(75) Inventors: Shinji Sugihara, Tokyo (JP); Ikunao Isomura, Yokohama (JP); Junji Oaki, Kawasaki (JP); Toru Tojo, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 572 days.

(21) Appl. No.: 11/072,317

(22) Filed: Mar. 7, 2005

(65) Prior Publication Data

US 2005/0232477 A1 Oct. 20, 2005

(30) Foreign Application Priority Data

Mar. 8, 2004 (JP) ............................ 2004-064054

(51) Int. Cl.
*G06K 9/00* (2006.01)
(52) U.S. Cl. ...................................... 382/145; 382/141
(58) Field of Classification Search ..................... None
See application file for complete search history.

(56) References Cited

U.S. PATENT DOCUMENTS 4,805,123 A * 2/1989 Specht et al. ............... 382/144

6,400,838 B2 6/2002 Watanabe
2003/0228037 A1* 12/2003 Endo ........................ 382/124

FOREIGN PATENT DOCUMENTS

| JP | 5-60699 | 3/1993 |
| JP | 5-198641 | 8/1993 |
| JP | 2003-98117 | 4/2003 |

* cited by examiner

*Primary Examiner*—Matthew C. Bella
*Assistant Examiner*—Alex Liew
(74) *Attorney, Agent, or Firm*—Finnegan, Henderson, Farabow, Garrett & Dunner, L.L.P.

(57) ABSTRACT

A defect inspection method comprises irradiating a sample including a pattern under inspection with light, acquiring measurement pattern data of the pattern based on intensity of light reflected by the sample, generating conversion data including pixel data corresponding to the measurement pattern data from design data of the sample, applying FIR filter process to the conversion data, reconstructing the conversion data by replacing pixel data having value not larger than first reference value with first pixel data, replacing pixel data having value larger than second reference value larger than first reference value with second pixel data having value larger than first pixel data, replacing pixel data having value larger than first reference value and less than second reference value with third pixel data having value between the value of first and second pixel data, the pixel data having larger value being replaced with third pixel data having higher value.

20 Claims, 3 Drawing Sheets

FIG. 3A

| 1/9 | 1/9 | 1/9 |
|---|---|---|
| 1/9 | 1/9 | 1/9 |
| 1/9 | 1/9 | 1/9 |

FIG. 3B

| 0 | 0 | 0 | 0 | 0 |
|---|---|---|---|---|
| 0 | 0 | 0 | 0 | 0 |
| 255 | 255 | 255 | 0 | 0 |
| 255 | 255 | 255 | 0 | 0 |
| 255 | 255 | 255 | 0 | 0 |

FIG. 3C

| 0 | 0 | 0 | 0 | 0 |
|---|---|---|---|---|
| 85 | 85 | 57 | 28 | 0 |
| 170 | 170 | 113 | 57 | 0 |
| 255 | 255 | 170 | 85 | 0 |
| 255 | 255 | 170 | 85 | 0 |

FIG. 3D

| 0 | 0 | 0 | 0 | 0 |
|---|---|---|---|---|
| 42 | 42 | 0 | 0 | 0 |
| 211 | 211 | 98 | 0 | 0 |
| 255 | 255 | 211 | 42 | 0 |
| 255 | 255 | 211 | 42 | 0 |

FIG. 4A

| 1/9 | 1/9 | 1/9 |
|---|---|---|
| 1/9 | 1/9 | 1/9 |
| 1/9 | 1/9 | 1/9 |

FIG. 4B

| 0 | 0 | 0 | 0 | 0 |
|---|---|---|---|---|
| 0 | 0 | 0 | 0 | 0 |
| 255 | 255 | 255 | 0 | 0 |
| 255 | 255 | 255 | 0 | 0 |
| 255 | 255 | 255 | 0 | 0 |

FIG. 4C

| 0 | 0 | 0 | 0 | 0 |
|---|---|---|---|---|
| 85 | 85 | 57 | 28 | 0 |
| 170 | 170 | 113 | 57 | 0 |
| 255 | 255 | 170 | 85 | 0 |
| 255 | 255 | 170 | 85 | 0 |

FIG. 4D

| 106 | 96 | 85 | 75 | 64 |
|---|---|---|---|---|
| 124 | 112 | 99 | 87 | 75 |
| 142 | 128 | 113 | 99 | 85 |
| 160 | 144 | 128 | 112 | 96 |
| 177 | 160 | 142 | 124 | 106 |

FIG. 4E

| 0 | 0 | 0 | 0 | 0 |
|---|---|---|---|---|
| 51 | 31 | 0 | 0 | 0 |
| 255 | 224 | 82 | 0 | 0 |
| 255 | 255 | 224 | 31 | 0 |
| 255 | 255 | 255 | 51 | 0 |

DEFECT INSPECTION APPARATUS AND DEFECT INSPECTION METHOD

CROSS-REFERENCE TO RELATED APPLICATIONS

This application is based upon and claims the benefit of priority from prior Japanese Patent Application No. 2004-064054, filed Mar. 8, 2004, the entire contents of which are incorporated herein by reference.

BACKGROUND OF THE INVENTION

1. Field of the Invention

The present invention relates to a defect inspection apparatus and a defect inspection method for inspecting a pattern defect of an object, and more particularly, the present invention relates to a defect inspection apparatus and a defect inspection method for inspecting a lithography mask for use in fabricating a semiconductor device or a liquid crystal display (LCD), or a semiconductor substrate or a liquid crystal substrate comprising a very small pattern.

2. Description of the Related Art

An improvement in yield is indispensable because manufacture of a large-scale integration (LSI) is generally costly. One of the causes which lower the yield includes a pattern defect of a lithography mask used when pattern is transferred onto a semiconductor wafer by lithography. In recent years, the minimum dimensions of a defect which must be detected have been smaller with the smaller LSI pattern dimensions formed on a semiconductor wafer. Thus, there is a need for providing a high precision defect inspection apparatus for inspecting a defect of a lithography mask for use in LSI manufacturing.

on the other hand, with the advancement of information technology or multimedia technology, as for the LCD, a liquid crystal substrate has been large-sized and a finer pattern of a thin film transistor or the like has been formed on the liquid crystal substrate. Therefore, it is required to inspect a very small pattern defect in a wide range. Accordingly, there is an urgent need for development of a defect inspection apparatus capable of inspecting a defect of a photo mask used when fabricating such a pattern of such a large area LCD and a large area LCD.

In a conventional defect inspection apparatus, a pattern formed on a sample under inspection such as a lithography mask is acquired as an image at a predetermined magnification by using an optical system similar to a microscope, and the acquired image is compared with design data, thereby carrying out inspection. The conventional defect inspection apparatus comprises a stage, a light source, an illumination optical system, a magnification optical system, a photoelectric converter section, a comparator circuit, a data memory, and a reference data generator section.

The sample is placed on the stage, and the stage moves, whereby a luminous flux scans on the sample. The light passed through the sample incomes into the photoelectric converter section via the illumination optical system and an optical image of the pattern is focused at the photoelectric converter section. The optical image is sent to the comparator circuit as measurement pattern data On the other hand, design pattern data of the sample read out from the data memory is sent to the reference data generator section. The reference data generator section converts the design pattern data into pixel data. In order to correct a deviation between finish dimensions of the pattern formed on the sample and a design value, a resize and corner rounding circuit (not shown) incorporated in the reference data generator section carries out a resizing process for moving an edge position of the pattern and a corner rounding process for rounding a pattern corner portion with respect to the pixel data.

The resized and corner-rounded pixel data is subjected to a proper filtering process, the filtered pixel data is converted into an image equivalent to an optical image, and is then sent to the comparator circuit as reference pattern data. The comparator circuit compares the measurement pattern data with the reference pattern data in accordance with a proper algorithm, and determines that a pattern defect occurs if these items of data do not match.

As the above-described resizing process, there has been proposed a method which extracts a graphical feature, and carries out correction based on the extracted graphical feature (Jpn. Pat. Appln. KOKAI Publications No. 5-60699 and No. 5-198641).

However, in a mask including a fine pattern such as an optical proximity correction (OPC) pattern applied to a most-advanced mask, the minimum graphical feature of the pattern becomes smaller than the size of one pixel. Thus, in the conventional method, a graphical feature has been hardly extracted or the shape of a graphics to be processed has become very complicated, whereby the lowering of precision occurs with the resizing process.

In addition, there has been proposed a method of carrying out a resizing process by using a combination of an expansion filter and a contraction filter (Jpn. Pat. Appln. KOKAI Publication No. 2003-98117). In this method, there is a problem that an error occurs with an optical filter at a later stage because a pattern edge blurs due to the filtering process.

If the precision of the resizing process is lowered as described above, the coincidence between the measurement pattern data and the reference pattern data is lowered. A false defect occurs because a defect free region is determined to be defective. This false defect causes the lowering of the defect detection sensitivity.

BRIEF SUMMARY OF THE INVENTION

According to an aspect of the present invention, there is provided a defect inspection apparatus comprising: a light irradiating device configured to irradiate a sample including a pattern under inspection with light; a data acquisition device configured to acquire measurement pattern data of the pattern based on intensity of light reflected by the sample or light passed through the sample; a data conversion device configured to generate conversion data including a plurality of pixel data corresponding to the measurement pattern data from design data of the sample; a filter processing device configured to apply a finite impulse response filter process to the conversion data; a data reconstruction device configured to reconstruct the conversion data applied the finite impulse response filter process; the data reconstruction device replacing pixel data having a value not larger than a first reference value in the conversion data with first pixel data, replacing pixel data having a value larger than a second reference value which is larger than the first reference value in the conversion data with second pixel data having a value larger than the first pixel data, and replacing pixel data having a value larger than the first reference value and less than the second reference value in the conversion data with third pixel data having a value between the value of the first pixel data and the second pixel data, the pixel data in the conversion having larger value being replaced with the third pixel data having higher value; a reference data producing device configured to produce reference pattern data by applying a blurring filter process which simulates an optical system to reconstructed conversion data; and a defect detecting device configured to detect a defect of the sample by comparing the reference pattern data and the measurement pattern data.

According to another aspect of the present invention, there is provided a defect inspection apparatus comprising: a light irradiating device configured to irradiate a sample including a pattern under inspection with light; a data acquisition device configured to acquire measurement pattern data of the pattern based on intensity of light reflected by the sample or light passed through the sample; a data conversion device configured to generate conversion data including a plurality of pixel data corresponding to the measurement pattern data from design data of the sample; a filter processing device configured to apply a finite impulse response filter process to the conversion data; a sub-pixel generating device configured to generate a plurality of sub-pixels from the plurality of pixel data in the conversion data to which the finite impulse response filter process has been applied, the sub-pixel generating device dividing an image corresponding to the plurality of pixel data into a plurality of pixels, dividing each of the plurality of pixels into a plurality of sub-pixels, and allotting a value for each of the sub-pixels, the value being interpolated by using a plurality of pixel data corresponding to a plurality of adjacent pixels; a counting device configured to count the number of sub-pixels having a value larger than a reference value for each of the plurality of pixels; a data reconstruction device configured to reconstruct the conversion data to which the finite impulse response filter has been applied, the data reconstruction device allotting a value proportional to the number of sub-pixels having a value larger than the reference value for each of the plurality of pixel data; a reference data producing device configured to produce reference pattern data by applying a blurring filter process which simulates an optical system to reconstructed conversion data; and a defect detecting device configured to detect a defect of the sample by comparing the reference pattern data and the measurement pattern data.

According to an aspect of the present invention, there is provided a defect inspection method comprising: irradiating a sample including a pattern under inspection with light; acquiring measurement pattern data of the pattern based on intensity of light reflected by the sample or light passed through the sample; generating conversion data including a plurality of pixel data corresponding to the measurement pattern data from design data of the sample; applying a finite impulse response filter process to the conversion data; reconstructing conversion data to which the finite impulse response filter process has been applied; the reconstructing the conversion data including replacing pixel data having a value not larger than a first reference value in the conversion data with first pixel data, replacing pixel data having a value larger than a second reference value which is larger than the first reference value in the conversion data with second pixel data having a value larger than the first pixel data, and replacing pixel data having a value larger than the first reference value and less than the second reference value in the conversion data with third pixel data having a value between the value of the first pixel data and the second pixel data, the pixel data in the conversion having larger value being replaced with the third pixel data having higher value; producing reference pattern data by applying a blurring filter process which simulates an optical system to the reconstructed conversion data; and detecting a defect of the sample by comparing the reference pattern data and the measurement pattern data.

BRIEF DESCRIPTION OF THE SEVERAL VIEWS OF THE DRAWING

FIGS. 3A to 3D are views showing an example of pattern data processing by using the defect inspection apparatus according to the first embodiment;

FIGS. 4A to 4E are views showing an example of pattern data processing by using a defect inspection apparatus according to a second embodiment.

DETAILED DESCRIPTION OF THE INVENTION

Hereinafter, embodiments of the present invention will be described with reference to the accompanying drawings.

FIRST EMBODIMENT

Figure 1:
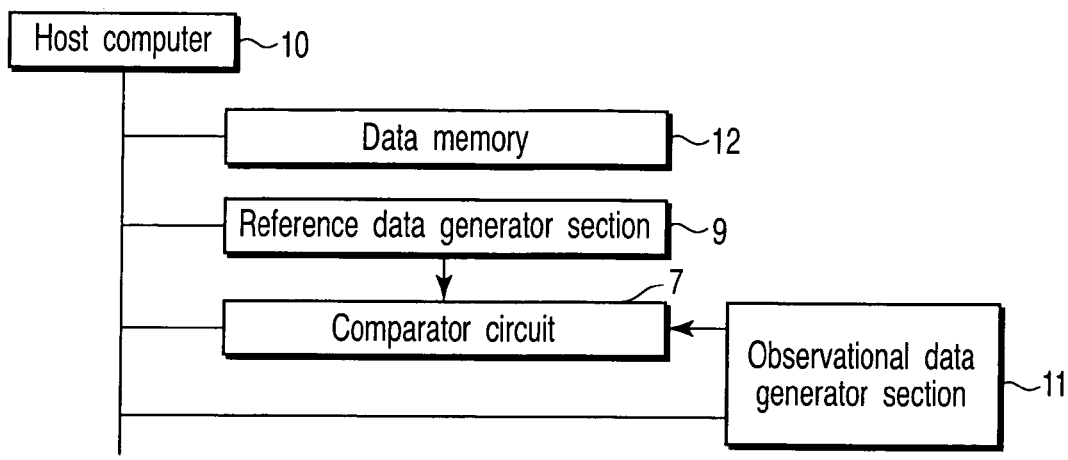
FIG. 1 is a block diagram schematically depicting a defect inspection apparatus according to a first embodiment.

FIG. 1 is a block diagram schematically depicting a defect inspection apparatus of the first embodiment.

As shown in FIG. 1, the defect inspection apparatus of the present embodiment comprises a host computer 10; a measurement data generator section 11 for generating measurement pattern data of a sample including a pattern under inspection, a reference data generator section 9 for generating reference pattern data which serves as an inspection reference; a comparator circuit 7 for comparing the measurement pattern data with the reference pattern data; and a data memory 12 for storing design pattern data and image data.

The sample is, for example, a lithography mask used when fabricating a semiconductor device or an LCD having a very small pattern.

Figure 2:
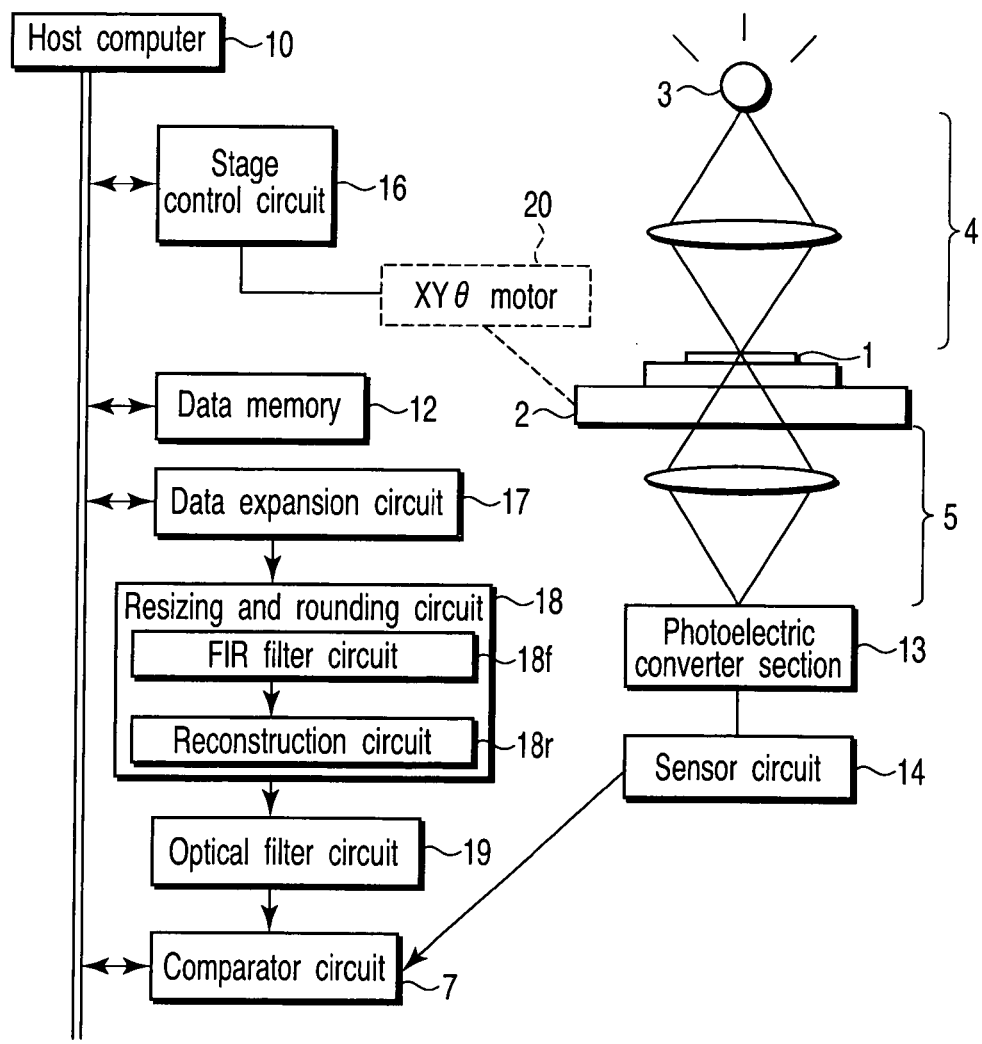
FIG. 2 is a schematic block diagram depicting a specific configuration of the defect inspection apparatus according to the first embodiment.

FIG. 2 is a schematic block diagram depicting a specific configuration of the defect inspection apparatus according to the present embodiment. As shown in FIG. 2, the measurement data generator section 11 comprises a light source 3; a sample stage 2 for placing a sample 1 under inspection; a optical system 4 for illuminating the sample 1; a magnification optical system 5 for acquiring an optical image which corresponds to a pattern of the sample 1; a photoelectric converter section 13 for converting an optical image into an electrical signal; a sensor circuit 14 for converting an sensor signal into measurement pattern data; and a stage control circuit 16 for controlling the sample stage 2.

On the other hand, as shown in FIG. 2, the reference data generator section 9 comprises a data circuit 17; a resizing and corner rounding circuit 18 (reconstructing means); and an optical filter circuit 19.

The sample 1 is automatically loaded onto the sample stage 2 by an auto loader mechanism, and the supplied sample is automatically ejected after inspection has been completed. The illumination optical system 4 including the light source 3 and a lens is allocated the sample stage 2. The light from the light source 3 irradiates the sample 1 via the lens incorporated in the optical system 4. The magnification optical system 5 and the photoelectric converter section 13 are allocated below the sample 1. Then, the transmission light passed through the sample 1 irradiates a sensor of the photoelectric converter section 13 via the magnification optical system 5 and is focused at the sensor. In the magnification optical system 5, focus adjustment is made by a auto focus device comprising a piezoelectric elements or the like.

The sample stage 2 can be moved in the X direction and Y direction by a three-axis (X-Y-θ) motor 20 and can be rotated in the θ direction. In the X, Y, and θ directions, this stage is controlled by an X-axis motor, a Y-axis motor, and a θ-axis motor, respectively. Here, stepping motors are used as the X motor, the Y motor, and the θ motor. The three-axis (X-Y-θ) motor 20 is controlled by the stage control circuit 16. The stage control circuit 16 controls the three-axis (X-Y-θ) motor 20 in accordance with a command received from the host computer 10.

A photo sensor used in the photoelectric converter section 13 serves as a line sensor or an area sensor having a plurality of optical sensors arranged thereon. When the sample stage 2 is continuously moved in the X-axis direction, the photodiode array detects a measurement signal which corresponds to a pattern of the sample 1.

The measurement signal detected by the photo sensor is converted into digital data by the sensor circuit 14 and is arranged, and is then sent to the comparator circuit 7 as measurement pattern data. The measurement pattern data serves as, for example, eight bit unsigned data, and expresses the brightness (gradation) of each pixel.

The measurement pattern data is read from the photoelectric converter section 13 synchronized with a clock frequency, and the read data is treated as raster image data through proper data rearrangement.

At the reference data generator section 9, design pattern data of the sample 1, which is read from the data memory 12, is sent to the data conversion circuit 17. The data conversion circuit 17 generates the design pattern data as design pixel data. The design pixel data includes a plurality of pixel data which correspond to the measurement pattern data.

Next, the design pixel data is sent to the resizing and corner rounding circuit 18. The resizing and corner rounding circuit 18 comprises an FIR filter circuit 18*f* for applying a finite impulse response (FIR) filtering process to pixel data D[i, j]; and a reconstruction circuit 18*r* for reconstructing pixel data D'[i, j] obtained by applying the FIR filtering process.

The FIR filter circuit 18*f* applies to the pixel data D [i, j] the FIR filtering process as shown in the following formula.

$$D'[k,l]=\Sigma_{ij}f[i,j]\cdot D[k-i,l-j]$$

Subsequently, the reconstruction circuit 18*r* applies operation shown in the following formula to the FIR filtered pixel data D', and reconstructs the pixel data D'.

$$\begin{rcases} D'' = 0: & Th1 >= D' \\ D'' = (D' - Th1) \times \dfrac{255}{(Th2 - Th1)}: & Th1 < D' < Th2 \\ D'' = 255: & D' >= Th2 \end{rcases} \quad (1)$$

Th1 (first reference value) and Th2 (second reference value) indicate threshold values of pixel conversion. A filter "f" is, for example, an n×n symmetrical filter, and is automatically calculated by a preset parameter. For example, a resize quantity and a corner rounding quantity are set as parameters, and the shape and size of the filter "f" and the threshold values used for pixel conversion are obtained from the resize quantity and the corner rounding quantity by using a conversion table or the like prepared in advance.

Here, it is possible to carry out arbitrary resizing and corner rounding processes at the same time by properly selecting a coefficient and a threshold value of the filter "f". Therefore, by properly selecting the shape and size of the filter "f" and the threshold values used for pixel conversion, the resizing and corner rounding processes can be carried out without lowering the precision for a fine pattern. As has been described above, according to the present embodiment, the resizing process can be carried out even if character recognition is not carried out. However, in the case where a pattern is not complicated, it is possible to carry out a process for recognizing character and changing the filter "f" and the threshold values in accordance with the recognized character. In addition, in the present embodiment, although the pixel data having a value which ranges from Th1 to Th2 has been converted into D" in accordance with a linear function, the pixel data may be converted in accordance with a quadrature function or any higher order function.

FIGS. 3A to 3D show an example of pattern data processing according to the present embodiment. A result obtained by applying a 3×3 filter shown in FIG. 3A to pixel data (FIG. 3B) in design pixel data is shown in FIG. 3C. The pixel data include any value ranging from 0 to 255, and a higher value indicates a higher light transmission rate.

In the case where the threshold value Th1=64 and the threshold value Th2=192, the pixel value (=113) of the center pixel shown in FIG. 3C is obtained as D"=98 in accordance with formula (1). The pixel value is replaced with this value. A result (reconstruction) obtained by carrying out similar processing for all the pixels is shown in FIG. 3D. From FIG. 3D, it is shown that the resizing and corner rounding processes are carried out.

The resizing and corner rounding processes according to the present embodiment is valid for a mask which includes a fine pattern such as an OPC pattern applied to an advanced mask because character recognition isn't necessary. In addition, this process is not a method that apply an expansion filter or the like. Thus, there does not occur a problem that a pattern edge blurs, and an error occurs with an optical filter at a later stage.

The reconstructed pixel data D" is sent to the optical filter circuit 19. The optical filter circuit 19 carries out filter operation which simulates a point spread function (PSF) of an optical system with respect to the reconstructed pixel data D". As a result, image data (reference pattern data) which is equivalent to an image acquired by the optical system is produced from the pixel data D". Filter operation is carried out by a FIR filter in accordance with the following formula, for example.

$$S[n,m]=\Sigma_{ij}psf[i,j]\cdot D[n-i,m-j]$$

The comparator circuit 7 reads the reference pattern data generated by the reference data generator section 9 and the measurement pattern data in the same coordinate, aligns the reference pattern data and the measurement pattern data, thereafter, compares the measurement pattern data with the reference pattern data by several algorithms, and judges existence of a defect in case where a predetermined difference is recognized between the two items of data.

As has been described above, according to the present embodiment, since the resizing and corner rounding processes can be carried out for a fine pattern without lowering precision, the precision of the reference pattern data is increased, so that the defect detection sensitivity of the defect inspection apparatus can be improved. In this manner, the yields of production of an exposure mask, a semiconductor device, an LCD and the like are improved, and a product return is decreased, so that the total production cost can be significantly reduced.

Figure 5:
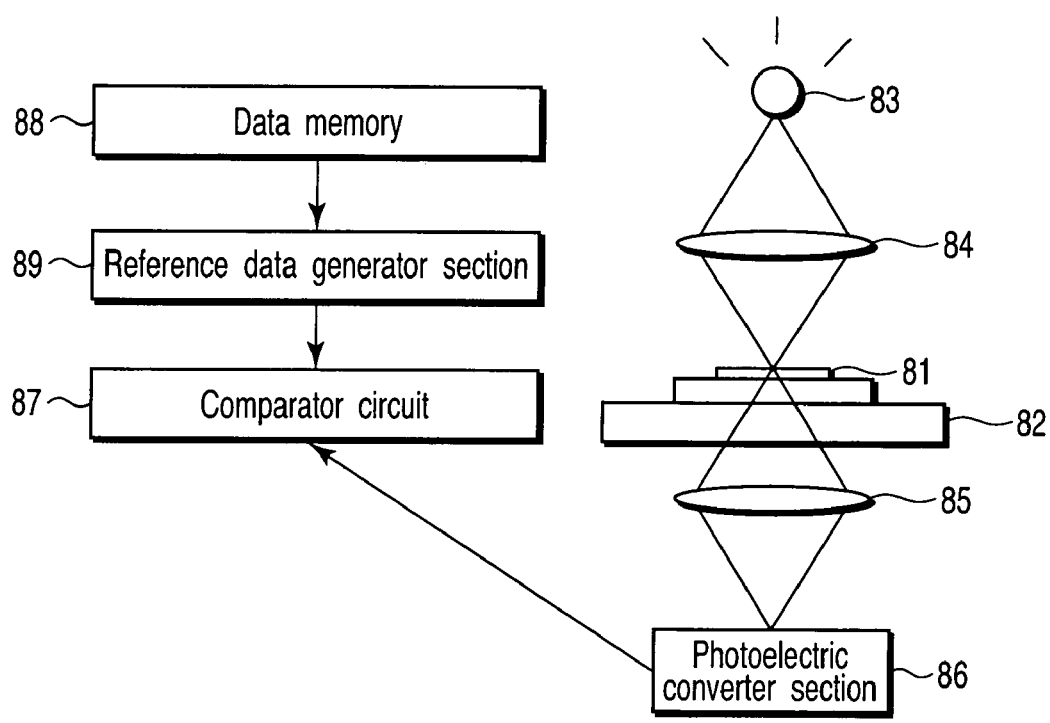
FIG. 5 is a block diagram schematically depicting a defect inspection apparatus according to a comparative example.

FIG. 5 is a block diagram schematically depicting a defect inspection apparatus according to a comparative example. In FIG. 5, reference numeral 81 denotes a sample under inspection, 82 denotes a stage, 83 denotes a light source, 84 denotes a illumination optical system, 85 denotes a magnification optical system, 86 denotes a photoelectric converter section, 87 denotes a comparator circuit, 88 denotes a data memory, and 89 denotes a reference data generator section.

SECOND EMBODIMENT

A defect inspection apparatus of the second embodiment will be described here. The items which are not mentioned in particular conform to the first embodiment.

At the reference data generator section 9, the design pattern data read from the data memory 12 is sent to the data conversion circuit 17, the data conversion circuit 17 generates the design pixel data which correspond to the measurement pattern data.

Next, the design pixel data is sent to the resizing and corner rounding circuit 18. In the resizing and corner rounding circuit 18, a FIR filtering process is applied to the pixel data D[i, j] in the same manner as in the first embodiment.

Next, an image corresponding to the FIR filtered pixel data is divided into, for example, 5×5 sub-pixels. It is preferable that the sub-pixels be finer in accordance with circuit performance because the finer sub-pixels cause higher precision. Interpolation is carried out based on a numerical value of the adjacent 3×3 pixels, and the resultant numerical value is filled to each of the divided sub-pixels.

Next, the sub-pixels and threshold values (reference values) are compared with each other, and the number of the sub-pixels exceeding the threshold value is counted for each pixel.

Then, a value of pixels (pixel value) is replaced with a value proportional to the count value, and the pixel data D' is reconstructed in accordance with the following formula.

$$D'' = C \times \frac{255}{25} \quad (2)$$

where C is the number of the sub-pixels exceeding the threshold value.

Here, by selecting the coefficient and threshold of the filter "f" properly, it is possible to carry out arbitrary resize quantity and corner rounding quantity. In addition, the processing in the formula (2) has advantageous effect of eliminating blurring of a pattern edge caused by the filter "f", so that an error of the reference pattern data processed by the optical filter circuit 19 can be reduced. According to the present embodiment, the resizing process can be precisely carried out for any pattern even if character recognition is not carried out. However, in the case where a pattern is not complicated, it is possible to carry out a process for recognizing character and changing the filter "f" and the threshold values in accordance with the recognized character.

FIGS. 4A to 4E each show an example of pattern data processing according to the present embodiment. A result obtained by applying a 3×3 filter (FIG. 4A) to design pixel data (FIG. 4B) is shown in FIG. 4C. A result obtained by dividing a center pixel (numeric value 113) of FIG. 4C into 5×5 sub-pixels and carrying out linear interpolation based on the adjacent 8 pixels is shown in FIG. 4D. The procedures for linear interpolation specifically conform to rules (0) to (4) below.

(0) An center sub-pixel in FIG. 4D is filled with the original pixel value (numerical value 113).

(1) A sub-pixel positioned above the center sub-pixel (numerical value 113) by two sub-pixels in FIG. 4D has numerical value 85, i.e., half the sum of the value (113) of the center sub-pixel shown in FIG. 4C and that (57) of the sub-pixel positioned immediately above the center sub-pixel (85=(113+57)/2).

(2) A sub-pixel positioned immediately above the center sub-pixel (numerical value 113) in FIG. 4D has numerical value 99, i.e., half the sum of the value (113) of the center sub-pixel shown in FIG. 4C and that (85) of the sub-pixel positioned above the center sub-pixel by two sub-pixels (99=(113+85)/2).

The sub-pixel (numeric value 85) positioned above the center sub-pixel by two sub-pixels immediately above the center sub-pixel in FIG. 4D can be obtained from FIG. 4C by using the rule (0) and (1). Thus, the sub-pixel (numeric value 99) positioned immediately above the center sub-pixel (numeric value 113) in FIG. 4D can be obtained from FIG. 4C. That is, linear interpolation is carried out based on the adjacent 8 sub-pixels.

(3) A sub-pixel positioned above right upper the center sub-pixel (numerical value 113) by two sub-pixels in FIG. 4D has numerical value 64, i.e., quarter the sum of the value (113) of the center sub-pixel shown in FIG. 4C and that (57) of the sub-pixel positioned immediately above the center sub-pixel, that (57) of the sub-pixel positioned immediately right the center sub-pixel and that (28) of the sub-pixel positioned immediately above right upper the center sub-pixel (64=(113+57+57+2)/4).

An sub-pixel positioned immediately right upper the center sub-pixel (numerical value 113) in FIG. 4D has numerical value 87, i.e., quarter the sum of the value (113) of the center sub-pixel shown in FIG. 4C and that (85) of the sub-pixel positioned above the center sub-pixel by two sub-pixels, that (85) of the sub-pixel positioned right the center sub-pixel by two sub-pixels and that (64) of the sub-pixel positioned above right upper the center sub-pixel by two sub-pixels (87=(113+85+85+64)/4).

Here, assuming that the threshold value is set to 128, C is equal to 8. From the formula (2), D' is equal to 82, and the numerical value 113 of the center pixel is replaced with 82. A result obtained by carrying out similar processing to all the pixels is shown in FIG. 4E.

The reconstructed pixel data D" is sent to the optical filter circuit 19. The optical filter circuit 19 carries out filter computation which simulates PSF of the optical system to the reconstructed pixel data D". As a result, the pixel data D" is converted into image data (reference pattern data) which is equivalent to an image acquired by the optical system.

The comparator circuit 7 takes in the reference pattern data generated by the reference data generator section 9 and the measurement pattern data in the same coordinate, aligns the reference pattern data and the measurement pattern data, thereafter, compares the measurement pattern data with the reference pattern data by several algorithms, and judges existence of a defect in case where a predetermined difference is recognized between the two items of data.

The present invention is not limited to the above described embodiments.

For example, in the present embodiments, the light incident to the photoelectric converter section 13 of the measurement data generator section 11 may be reflection light without being limited to transmission light. Further, transmission and reflection light beams both may be used at the same time.

The photoelectric converter section 13 can be used in plurality without being limited to such singular converter section.

Further, the filter applied in the resizing and corner rounding circuit 18 can be used in plurality without being limited to such singular circuit.

Furthermore, pixel reconstruction in the resizing and corner rounding circuit 18 is not limited to the above described conversion formula.

Still furthermore, the filtering process applied in the optical filter circuit 19 may include an arbitrary filtering process such as a linear filtering process or a nonlinear filtering process without being limited to the FIR filtering process.

What is claimed is:

1. A defect inspection apparatus comprising:
    a light irradiating device configured to irradiate a sample including a pattern under inspection with light;
    a data acquisition device configured to acquire measurement pattern data of the pattern based on intensity of light reflected by the sample or light passed through the sample;
    a data conversion device configured to generate conversion data including a plurality of pixel data corresponding to the measurement pattern data from design data of the sample;
    a filter processing device configured to apply a finite impulse response filter process to the conversion data;
    a data reconstruction device configured to reconstruct the conversion data applied the finite impulse response filter process; the data reconstruction device replacing pixel data having a value not larger than a first reference value in the conversion data with first pixel data, replacing pixel data having a value larger than a second reference value which is larger than the first reference value in the conversion data with second pixel data having a value larger than the first pixel data, and replacing pixel data having a value larger than the first reference value and less than the second reference value in the conversion data with third pixel data having a value between the value of the first pixel data and the second pixel data, the pixel data in the conversion having larger value being replaced with the third pixel data having higher value;
    a reference data producing device configured to produce reference pattern data by applying a blurring filter process which simulates an optical system to reconstructed conversion data; and
    a defect detecting device configured to detect a defect of the sample by comparing the reference pattern data and the measurement pattern data.

2. The defect inspection apparatus according to claim 1, wherein the sample is an exposure mask, a semiconductor substrate, or a liquid crystal substrate.

3. The defect inspection apparatus according to claim 1, wherein the light irradiating device includes a light source and a lens which focuses light emitted from the light source onto the sample.

4. The defect inspection apparatus according to claim 1, wherein the data acquisition device includes a photodiode array to convert the light into an electrical signal and a circuit to convert the electrical signal into digital data.

5. The defect inspection apparatus according to claim 1, wherein the blurring filter process satisfies $D'[k, l]=\Sigma_{ij}f[i, j]\cdot D[i, i]$, where $D[i, j]$ is a value of pixel data before being filtered; $D'[k, l]$ is a value of pixel data after being filtered; and $f[i, j]$ is an FIR filter.

6. The defect inspection apparatus according to claim 1, wherein pixel data having the value larger than the first reference value and smaller than the second reference value satisfies a relationship of $D''=a\times D'+b$, where $D'$ is a value of pixel data before being replaced; $D''$ is a value of pixel data after being replaced; a is a positive constant; and b is a positive constant.

7. A defect inspection apparatus comprising:
    a light irradiating device configured to irradiate a sample including a pattern under inspection with light;
    a data acquisition device configured to acquire measurement pattern data of the pattern based on intensity of light reflected by the sample or light passed through the sample;
    a data conversion device configured to generate conversion data including a plurality of pixel data corresponding to the measurement pattern data from design data of the sample;
    a filter processing device configured to apply a finite impulse response filter process to the conversion data;
    a sub-pixel generating device configured to generate a plurality of sub-pixels from the plurality of pixel data in the conversion data to which the finite impulse response filter process has been applied, the sub-pixel generating device dividing an image corresponding to the plurality of pixel data into a plurality of pixels, dividing each of the plurality of pixels into a plurality of sub-pixels, and allotting a value for each of the sub-pixels, the value being interpolated by using a plurality of pixel data corresponding to a plurality of adjacent pixels;
    a counting device configured to count the number of sub-pixels having a value larger than a reference value for each of the plurality of pixels;
    a data reconstruction device configured to reconstruct the conversion data to which the finite impulse response filter has been applied, the data reconstruction device allotting a value proportional to the number of sub-pixels having a value larger than the reference value for each of the plurality of pixel data;
    a reference data producing device configured to produce reference pattern data by applying a blurring filter process which simulates an optical system to reconstructed conversion data; and
    a defect detecting device configured to detect a defect of the sample by comparing the reference pattern data and the measurement pattern data.

8. The defect inspection apparatus according to claim 7, wherein the sample is an exposure mask, a semiconductor substrate, or a liquid crystal substrate.

9. The defect inspection apparatus according to claim 7, wherein the light irradiating device includes a light source and a lens which focuses light emitted from the light source onto the sample.

10. The defect inspection apparatus according to claim 7, wherein the data acquisition device includes a photodiode array to convert the light into an electrical signal and a circuit which convert the electrical signal into digital data.

11. The defect inspection apparatus according to claim 7, wherein the blurring filter process satisfies $D'[k, l]=\Sigma_{ij}f[i, j] \cdot D[i, i]$, where $D[i, j]$ is a value of pixel data before being filtered; $D'[k, l]$ is a value of pixel data after being filtered; and $f[i, j]$ is an FIR filter.

12. A defect inspection method comprising:
irradiating a sample including a pattern under inspection with light;
acquiring measurement pattern data of the pattern based on intensity of light reflected by the sample or light passed through the sample;
generating conversion data including a plurality of pixel data corresponding to the measurement pattern data from design data of the sample;
applying a finite impulse response filter process to the conversion data;
reconstructing conversion data to which the finite impulse response filter process has been applied; the reconstructing the conversion data including replacing pixel data having a value not larger than a first reference value in the conversion data with first pixel data, replacing pixel data having a value larger than a second reference value which is larger than the first reference value in the conversion data with second pixel data having a value larger than the first pixel data, and replacing pixel data having a value larger than the first reference value and less than the second reference value in the conversion data with third pixel data having a value between the value of the first pixel data and the second pixel data, the pixel data in the conversion having larger value being replaced with the third pixel data having higher value;
producing reference pattern data by applying a blurring filter process which simulates an optical system to the reconstructed conversion data; and
detecting a defect of the sample by comparing the reference pattern data and the measurement pattern data.

13. The defect inspection method according to claim 12, wherein the sample is an exposure mask, a semiconductor substrate, or a liquid crystal substrate.

14. The defect inspection method according to claim 12, wherein the blurring filter process satisfies $D'[k, l]=\Sigma_{ij}f[i, j] \cdot D[i, i]$, where $D[i, j]$ is a value of pixel data before being filtered; $D'[k, l]$ is a value of pixel data after being filtered; and $f[i, j]$ is an FIR filter.

15. The defect inspection method according to claim 12, wherein pixel data having the value larger than the first reference value and smaller than the second reference value satisfies a relationship of $D''=a \times D'+b$, where $D'$ is a value of pixel data before being replaced; $D''$ is a value of pixel data after being replaced; a is a positive constant; and b is a positive constant.

16. The defect inspection method according to claim 15, wherein $f[i, j]$, the first reference value and the second reference value are selected so that a resizing process and a rounding process are carried out for the conversion data at the same time.

17. A defect inspection method comprising:
irradiating a sample including a pattern under inspection with light;
acquiring measurement pattern data of the pattern based on intensity of light reflected by the sample or light passed through the sample;
generating conversion data including a plurality of pixel data corresponding to the measurement pattern data from design data of the sample;
applying a finite impulse response filter process to the conversion data;
generating a plurality of sub-pixels from the plurality of pixel data in the conversion data to which the finite impulse response filter process has been applied, the generating the plurality of sub-pixels including dividing an image corresponding to the plurality of pixel data into a plurality of pixels, dividing each of the plurality of pixels into a plurality of sub-pixels, and allotting a value for each of the sub-pixels, the value being interpolated by using a plurality of pixel data corresponding to a plurality of adjacent pixels;
counting the number of sub-pixels having a value larger than a reference value for each of the plurality of pixels;
reconstructing the conversion data to which the finite impulse response filter has been applied, the reconstructing the conversion data including allotting a value proportional to the number of sub-pixels having a value larger than the reference value for each of the plurality of pixel data;
producing reference pattern data by applying a blurring filter process which simulates an optical system to reconstructed conversion data; and
detecting a defect of the sample by comparing the reference pattern data and the measurement pattern data.

18. The defect inspection method according to claim 17, wherein the sample is an exposure mask, a semiconductor substrate, or a liquid crystal substrate.

19. The defect inspection method according to claim 17, wherein the blurring filter process satisfies $D'[k, l]=\Sigma_{ij}f[i, j] \cdot D[i, i]$, where $D[i, j]$ is a value of pixel data before being filtered; $D'[k, l]$ is a value of pixel data after being filtered; and $f[i, j]$ is an FIR filter.

20. The defect inspection method according to claim 19, wherein $f[i, j]$ and the reference value are selected so that a resizing process and a rounding process are carried out for the conversion data at the same time.

* * * * *

UNITED STATES PATENT AND TRADEMARK OFFICE
CERTIFICATE OF CORRECTION

PATENT NO. : 7,359,546 B2  Page 1 of 1
APPLICATION NO. : 11/072317
DATED : April 15, 2008
INVENTOR(S) : Sugihara et al.

It is certified that error appears in the above-identified patent and that said Letters Patent is hereby corrected as shown below:

Claim 19, column 12, line 47, change "D'[k, I)" to --D'(k, l)--.

Signed and Sealed this

Eighth Day of July, 2008

JON W. DUDAS
*Director of the United States Patent and Trademark Office*